United States Patent [19]

Shepler

[11] Patent Number: 4,672,556

[45] Date of Patent: Jun. 9, 1987

[54] FREQUENCY DETECTOR SYSTEM

[75] Inventor: John E. Shepler, Rockford, Ill.

[73] Assignee: Sundstrand Corporation, Rockford, Ill.

[21] Appl. No.: 650,952

[22] Filed: Sep. 17, 1984

[51] Int. Cl.[4] ............ G01R 23/00; G01R 29/02; H03K 21/38; H03K 5/13

[52] U.S. Cl. ............ 364/484; 328/155; 328/129.1; 377/20; 377/107; 324/174; 364/565

[58] Field of Search ........... 364/484, 565, 571; 328/155, 129.1; 377/20, 107, 16; 324/166, 174, 78 R

[56] References Cited

U.S. PATENT DOCUMENTS

| | | | |
|---|---|---|---|
| 3,399,354 | 8/1983 | Schaeffer | 364/565 X |
| 3,982,199 | 9/1976 | Green | 377/107 X |
| 4,079,315 | 3/1978 | Mohr | 377/20 X |
| 4,150,432 | 4/1979 | Sorden | 364/484 |
| 4,216,530 | 8/1980 | Yamaki et al. | 377/20 X |
| 4,219,878 | 8/1980 | Goodson et al. | 364/565 |
| 4,257,005 | 3/1981 | Hall | 377/20 X |
| 4,270,176 | 5/1981 | Skarvada | 364/565 |
| 4,350,950 | 9/1982 | Waldmann et al. | 364/484 X |
| 4,395,762 | 7/1983 | Wondergem et al. | 377/20 X |
| 4,398,260 | 8/1983 | Takahashi et al. | 364/565 |
| 4,404,648 | 9/1983 | Miyakawa et al. | 364/900 |
| 4,420,809 | 12/1983 | Pierce | 364/484 |
| 4,527,248 | 7/1985 | Takase et al. | 364/565 |
| 4,581,713 | 4/1986 | Fennel | 364/565 X |
| 4,584,528 | 4/1986 | Ohmae et al. | 377/20 X |
| 4,609,990 | 9/1986 | Sember et al. | 324/78 R X |

Primary Examiner—Errol A. Krass
Assistant Examiner—Joseph L. Dixon
Attorney, Agent, or Firm—Wood, Dalton, Phillips Mason & Rowe

[57] ABSTRACT

A frequency detector in a frequency control for a generating system includes a system processor and a counter for deriving a digital count proportional to the output frequency of the generating system. The system processor executes a series of control cycles during which the processor controls the speed at which the generating system is driven in accordance with the output frequency. The system processor detects the digital count at a predetermined point in each control cycle and resets the counter to initiate generation of a new digital count. The data from the detector does not require an interrupt handling procedure and hence complexity is minimized.

19 Claims, 6 Drawing Figures

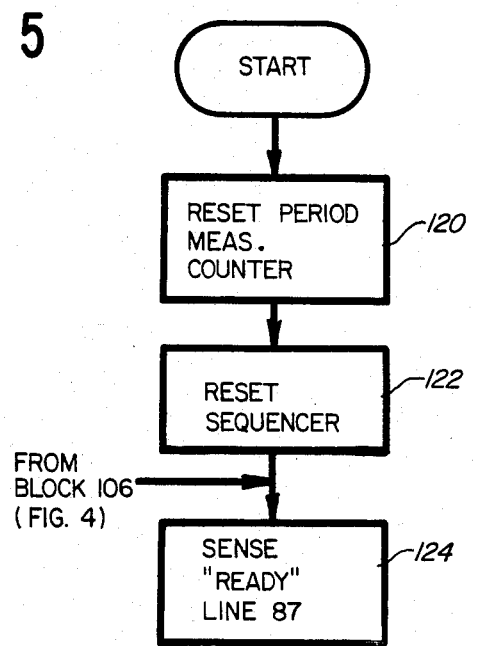
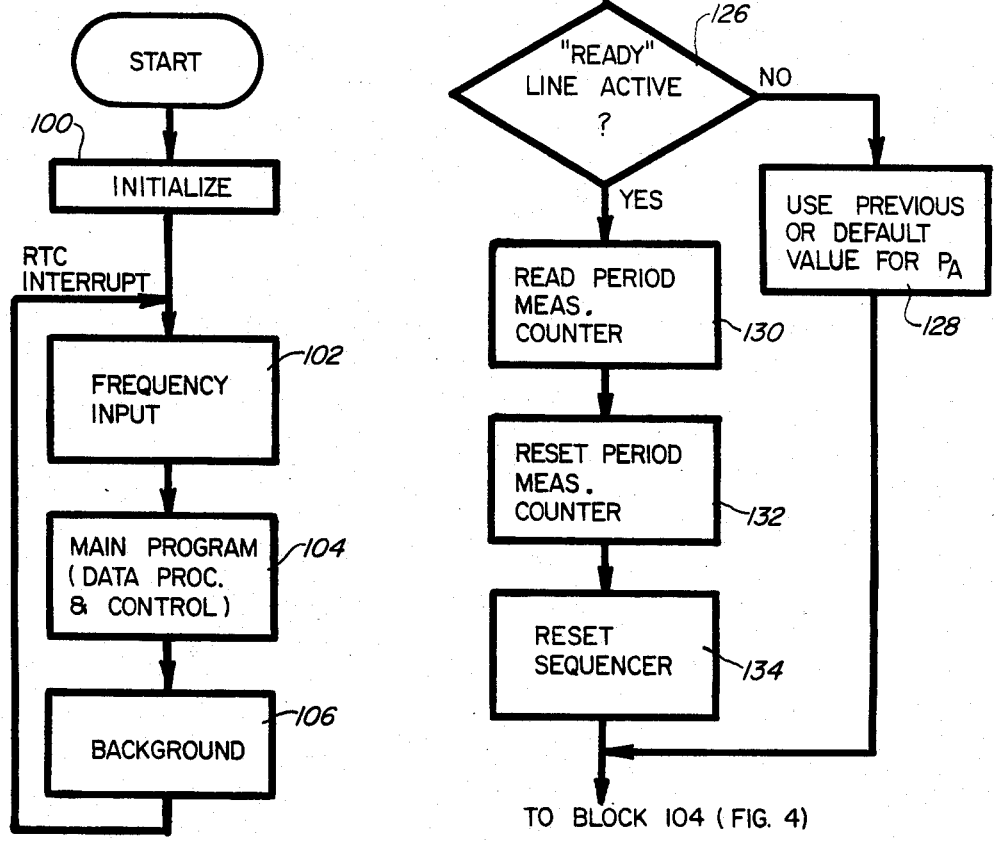

FREQUENCY DETECTOR SYSTEM

TECHNICAL FIELD

The present invention relates generally to a generator control system, and more particularly to a system for detecting the output frequency of a generating system.

BACKGROUND ART

A prior generating system has been developed by the assignee of the instant application which includes a main generator, an exciter and a permanent magnet generator, (PMG), all of which are driven by a source of motive power and a constant speed drive (CSD). The frequency of the output power from the main generator is maintained within closely prescribed limits by means of a frequency control implemented by a microprocessor. The microprocessor controls a servo valve in the CSD, and hence the output speed of the CSD, depending upon the frequency of the waveform developed by the PMG. In such a frequency control, a divider/counter counts the number of pulses developed by a system clock between particular points in the wave form from the PMG to derive an indication of the period, and hence the frequency, of the waveform. Once the frequency indication is derived, an interrupt is coupled to the microprocessor which is processed by an interrupt handler to halt main program execution so that the data representing the frequency of the PMG output can be sensed by the microprocessor. Following the interrupt, main program execution resumes within the microprocessor so that it can accomplish the required control functions.

While the above system has been found satisfactory to control output frequency of a generator system such as that described above, the small number of interrupt inputs and handlers provided by the microprocessor has limited the ability of the microprocessor to control other functions in the generating system. When it is desirable or necessary to control functions in the system requiring interrupt inputs and handlers beyond that which can be accomodated by the microprocessor, an additional chip or chips must be provided to accomplish the interrupt handling function. Moreover, the software for handling an interrupt can become quite complex requiring additional programming above and beyond that required to implement the control functions.

The use of an interrupt procedure for data input also reduces the length of time remaining in each control cycle to accomplish control functions. In a real time based system, such as that described above, it would be desirable to reduce as much as possible the number of interrupts to be handled in a control cycle to in turn provide more time for other functions.

Other systems which rely upon an interrupt procedure to accomplish data input are disclosed in: Miyakawa U.S. Pat. No 4,404,648; Takahashi U.S. Pat. No. 4,398,260; Skarvada U.S. Pat. No. 4,270,176; and Goodson U.S. Pat. No. 4,291,878.

DISCLOSURE OF THE INVENTION

In accordance with the present invention, the above problems are obviated by a frequency control for a generating system which includes means for allowing frequency information to be detected by a microprocessor or other system processor without the use of interrupts and interrupt handlers.

The frequency control of the present invention includes means for deriving an indication of the output frequency of the generating system which includes means for sensing the frequency of the output of a PMG of the generating system or the output of an MPU. The indication of output frequency is coupled to a system processor which executes a series of control cycles during which the processor controls the speed at which the generating system is driven based upon the output frequency. The indication of output frequency is detected by the microprocessor at a particular point in each control cycle rather than at random intervals by means of an interrupt procedure.

The indication deriving means includes means coupled to the PMG or MPU for counting of the number of clock pulses which are developed by the processor during an interval between particular points in the PMG or MPU output waveform. Also included are means for generating a ready signal indicating that the count is ready to be sensed and means for holding the count until a reset signal is coupled to a reset input of the counting means. When the processor detects the presence of the ready signal at the predetermined point in a control cycle, the indication of output frequency is sensed. A reset signal is then generated by the processor after the count is sensed to initiate development of a new count.

Once the processor has received the count, it is compared against a desired value, and the result of the comparison is in turn used to control a servo valve in the constant speed drive to adjust the speed of the shaft and hence the frequency of the generator output.

Since the control system incorporating the frequency detector of the present invention does not require an interrupt procedure to input data, the processor can be utilized to control additional functions and/or the number of chips required to implement the generator control system can be reduced. Furthermore, the required programming to implement the system can be reduced as compared with a comparable system which utilizes an interrupt procedure.

BRIEF DESCRIPTION OF THE DRAWINGS

FIG. 4 is a flow chart of the overall programming contained within the microprocessor shown in FIG. 3;

FIG. 5 is a more detailed flow chart illustrating the programming of the "initialize" and "frequency input" blocks shown in FIG. 4.

BEST MODE FOR CARRYING OUT THE INVENTION

Figure 1:
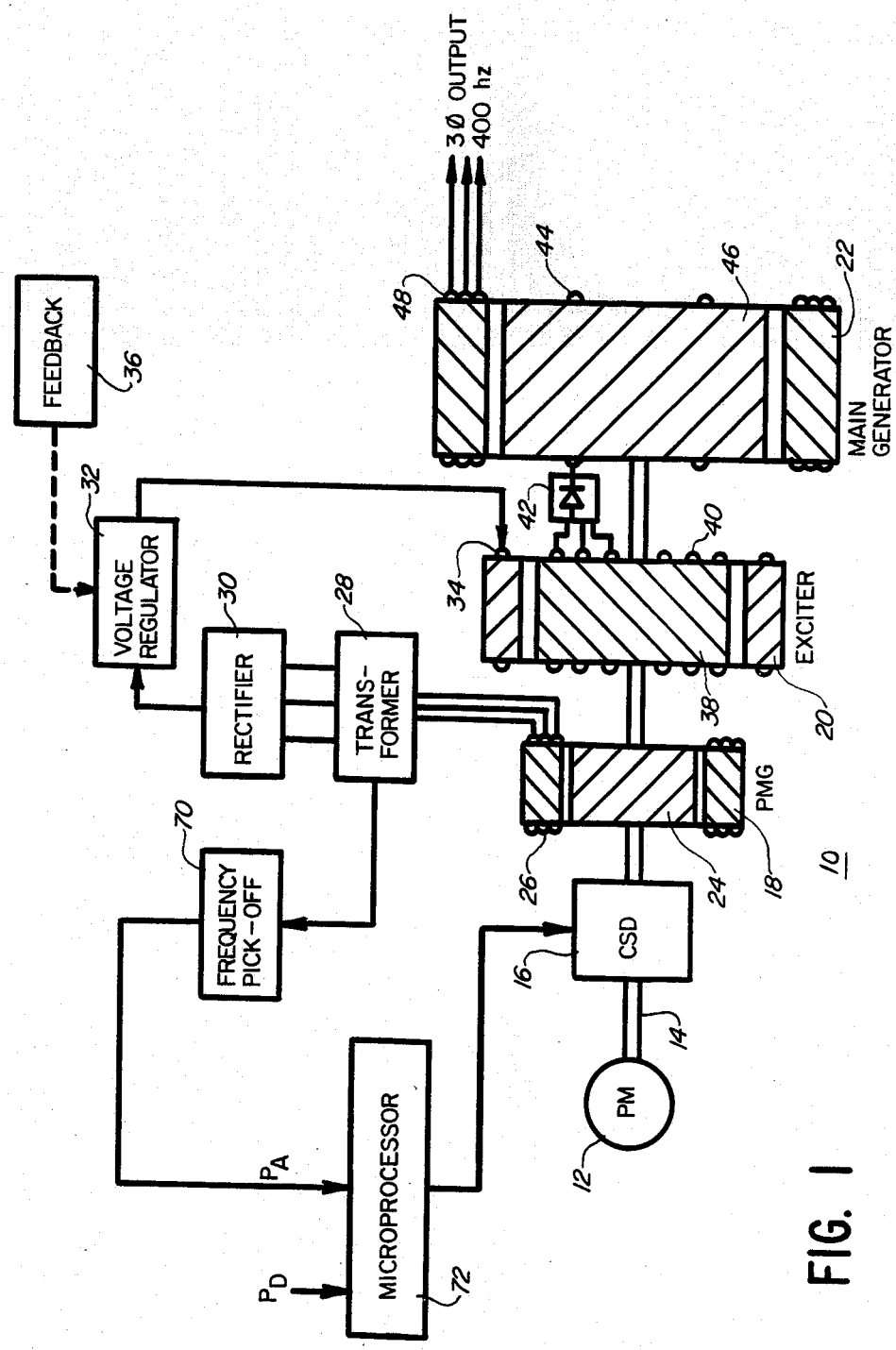
FIG. 1 is a combined diagrammatic and block diagram of a generator system incorporting a frequency control system.

Referring now to FIG. 1, there is illustrated a generating system 10, sometimes referred to as an intergrated drive generator, which is driven by a source of motive power in the form of a prime mover 12. The prime mover 12 is coupled by means of a shaft 14 to a constant speed drive, or CSD 16, and to the rotor structures of a permanent magnet generator, or PMG 18, an exciter 20 and a main generator 22. The constant speed drive 16 converts the variable speed output from the prime mover 12 into constant speed motive power to drive the electromagnetic structures 18, 20, and 22.

As is usual in such types of generating systems, rotation of the shaft 14 and the rotor structure 24 of the PMG 18 causes generation of polyphase power in stator windings 26. The polyphase power is coupled to a transformer 28 and to a rectifier 30 which converts the polyphase power into DC power. This DC power is coupled to a voltage regulator 32 which provides a controlled DC level to a field winding 34 of the exciter 20, the DC level being a function of the output desired from the main generator 22. This regulation may be accomplished by means of feedback circuitry, illustrated generally at 36, which may sense various output parameters of the main generator 22, such as output voltage, output current or the like.

The voltage regulator may also provide power to other components of the generating system as is conventional.

Rotation of the shaft 14 and the rotor structure 38 of the exciter 20 in turn causes generation of a polyphase alternating current waveform in a set of armature windings 40 of the exciter 20. This polyphase power is converted into DC power by a rectifier 42 and is coupled to a field winding 44 of the main generator 22. The rotation of the rotor 46 of the main generator 22 in turn causes the generation of polyphase output power in armature windings 48 in the stator of the main generator 22.

In FIG. 1, the output power from the main generator 22 is illustrated as being three phase AC power at 400 hz. It should be noted that the output power from the main generator may consist of a different number of phases at a different frequency, if desired.

Figure 2:
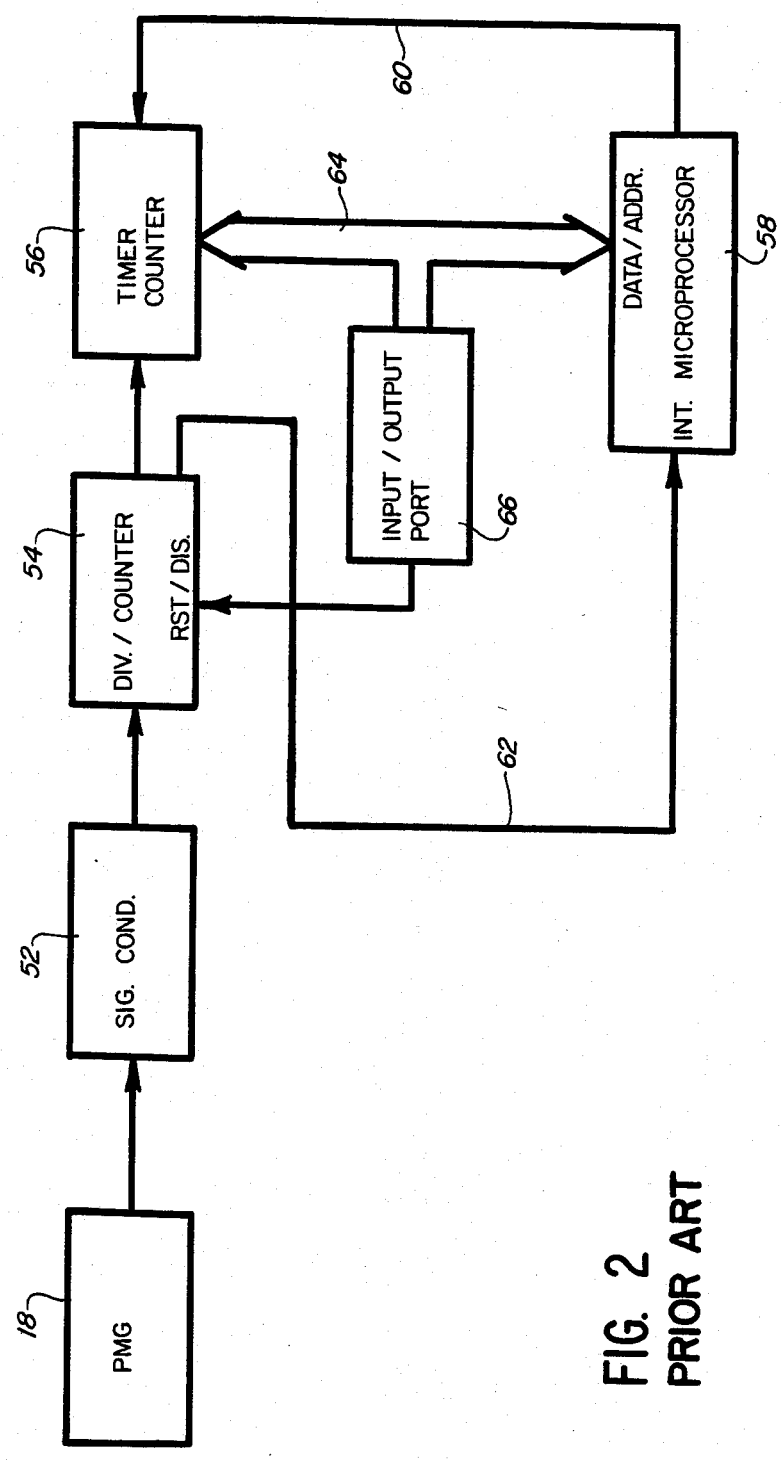
FIG. 2 is a block diagram of a prior art frequency control system for the generator system shown in FIG. 1.

Referring now to FIG. 2, there is illustrated a prior art frequency detector which has been utilized in conjunction with the generator system 10 shown in FIG. 1. The frequency detector detects the output frequency of the PMG 18 via a signal conditioner 52 which converts the PMG output into a series of rectangular pulses which are in turn coupled to a divider/counter 54. The divider/counter 54 is initially set to a value which disables counting in timer counter 56. After the first pulse is received from the signal conditioner 52, the divider/counter 54 counts to a value that enables counting in Timer Counter 56. As pulses are received from the signal conditioner 52, the divider/counter 54 counts to a value that disables the timer counter 56 and sends an interrupt signal on a line 62 which is connected to an interrupt input of the microprocessor 58. At this point, the microprocessor reads the contents of the timer/counter 56 over a data bus 64, and in addition provides a reset pulse through an input/output port 66 to a reset input of the divider/counter 54. The circuit 54 is held in a reset state as the data from the timer/counter 56 is read over the bus 64. The microprocessor 58 then utilizes the data from the timer/counter 56 to derive an indication of the frequency of the generating system. In addition, the reset is removed from the circuit 54.

As previously noted, the system shown in FIG. 2 requires the use of an interrupt handler in the microprocessor 58. This not only reduces the number of interrupt handlers for other functions to be performed by the microprocessor 58 but also increases the complexity of the programming required therefor and, in addition, reduces the control functions which can be implemented.

Figure 3:
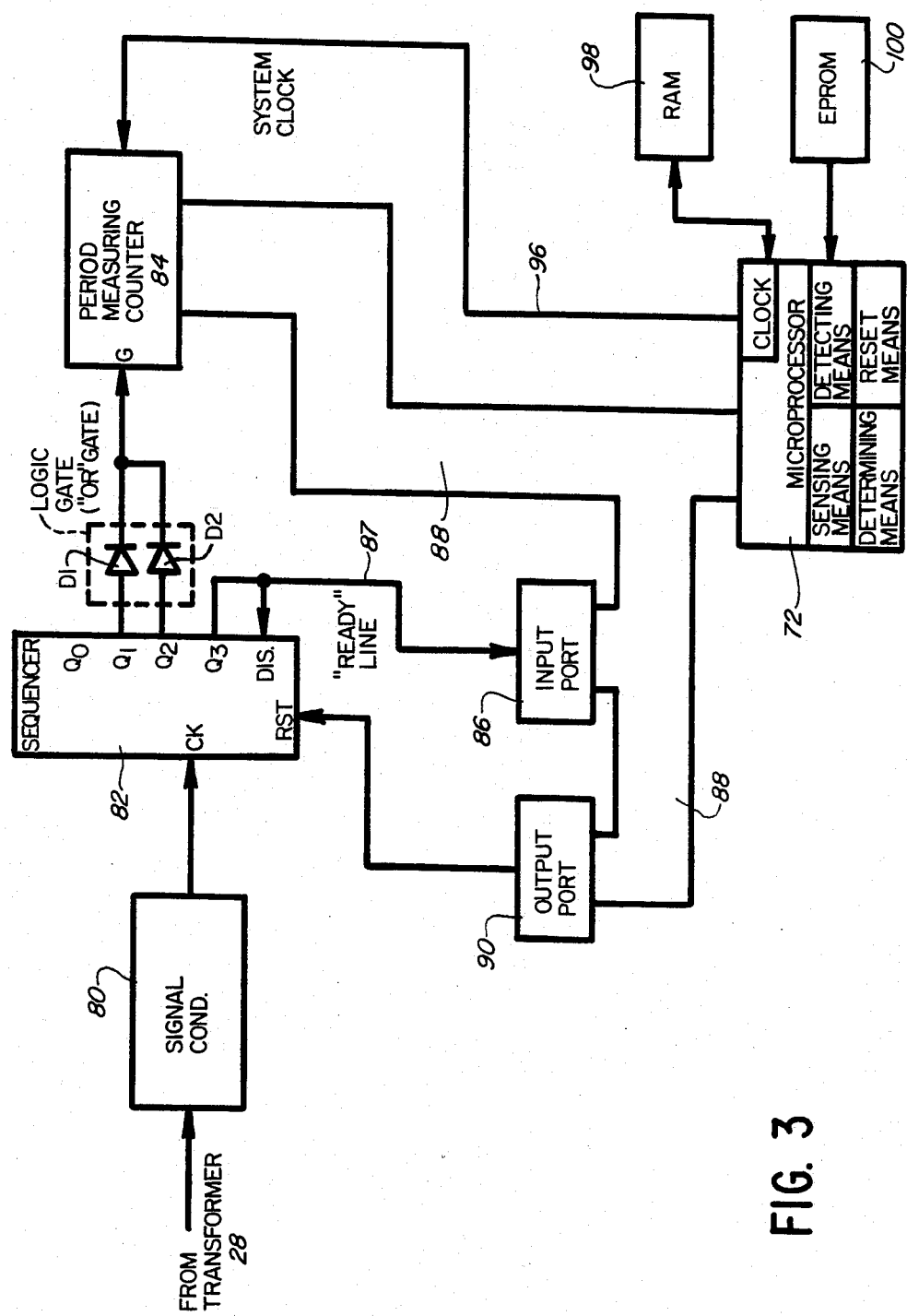
FIG. 3 is a block diagram of a frequency control system incorporating the frequency detector of the present invention which may be utilized in place of the frequency control system shown in FIG. 2.

Referring now to FIG. 3, the above disadvantages have been overcome by the frequency control of the present invention, which as previously noted, does not require an interrupt procedure to input information into the system processor. As seen in FIGS. 1 and 3, a line to line voltage signal from the PMG 18 is coupled from the transformer 28 to a frequency pickoff 70 which provides data to a system processor in the form of a microprocessor 72 indicative of the period, and hence the frequency, of the power developed by the PMG 18. Since the PMG 18 and main generator 22 are driven at the same speed, the frequency of the main generator output is proportional to the frequency of the PMG output and hence the latter can be utilized to obtain output frequency information. This data, designated $P_A$, is compared by the microprocessor 72 against a desired value, designated $P_D$, and the result of the comparison is utilized to control a servo valve (not shown) in the constant speed drive 16 to in turn control the speed at which the PMG, exciter and main generator are driven.

As seen in FIG. 3, the output derived from the transformer 28 is coupled to a signal conditioning circuit 80 which develops a series of input pulses at a frequency proportional to the output frequency. The output from the conditioning circuit 80 is coupled to a sequencer 82 which, in the preferred embodiment, comprises a binary counter which effects a gating function. The sequencer 82 includes a pair of outputs $Q_1$ and $Q_2$ which are coupled together by means of diodes D1 and D2 into a logical OR configuration. The diodes D1 and D2 are in turn connected to a gating input of a period measuring or clock pulse counter 84, described more specifically below.

The sequencer 82 also includes an output $Q_3$ and a pair of inputs, denoted DIS and RST which denote disable and reset inputs, respectively. The $Q_3$ output is coupled to the DIS input and to an input port 86 over a "ready" line 87. The input port 86 is in turn coupled to the microprocessor 72 over a data/address bus 88.

Also coupled to the data/address bus 88 is an output port 90 which is coupled to the reset input RST.

The microprocessor 72 is also coupled to the period measuring counter over the data/address bus 88. Also, the microprocessor includes a system clock which is coupled to a clock input of the counter 84 by means of a line 96. The microprocessor 72 operates in conjunction with a random access memory, or RAM 98 and an erasable programmable read only memory or EPROM 100. The EPROM 100 contains the control program for the microprocessor 72 while the RAM 98 contains registers and flags which are used to store various intermediate and final results generated by the control program.

Referring now to FIG. 4, the microprocessor 72 includes means for executing a series of control cycles during which time various parameters are sensed by the microprocessor 72 and control over various functions is accomplished. Following start-up of the microprocessor 72 a block 100 initializes the variables and flags used in the control process. A block 102 then senses the frequency of the power from the PMG 18. This information is utilized by a main program 104 which performs the various data processing and control functions. Control then passes to a block 106, labeled BACKGROUND, which occupies the balance of the cycle time. The BACKGROUND block 106 may be simply a pause until a real time clock interrupt is generated or may include various tests such as memory tests or the like, if desired.

Once a real time clock interrupt has been generated, control returns to the block 102 where the frequency is again sensed.

Figure 6:
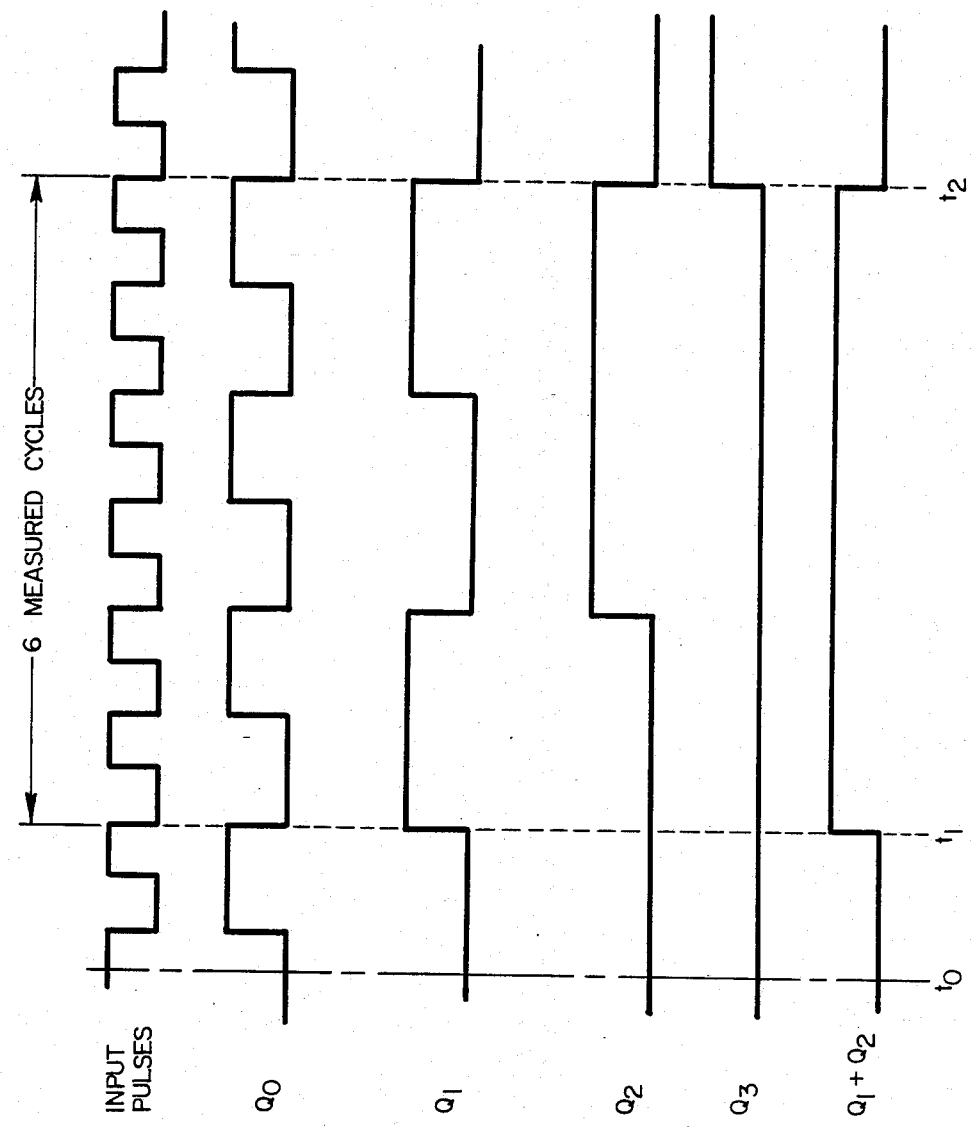
FIG. 6 is a series of waveform diagrams illustrating the operation of the circuitry shown in FIG. 3.

Referring now to FIGS. 3, and 6, assume that at time $t=t_0$, a reset pulse is developed by the microprocessor 72 and is coupled over the data/address bus 88 and the output port 90 to the reset input RST of the sequencer 82. At this point, each of the outputs $Q_0$–$Q_3$ is reset to a low state. The sequencer 82 then begins counting the number of pulses received from the signal conditioner 80. Upon receipt of the second falling edge from the signal conditioner 80 at $t=t_1$, the output $Q_1$ assumes a high state, in turn providing a high state gating signal to the gate input of the period measuring counter 84. The counter 84 then begins to accumulate system clock pulses in an interval during which a particular number of input pulses have been accumulated by sequencer 82. During this interval a digital count is developed in a register within the counter 84, which is coupled to the data/address lines 88. As additional pulses are received by the sequencer 82, the outputs $Q_1$ and $Q_2$ remain high until the eighth falling edge from time $t_0$ is received at the input CK of the sequencer 82. Upon receipt of this falling edge at $t=t_2$, the outputs $Q_1$ and $Q_2$ return to a low state and the output $Q_3$ assumes a high state. This high state signal is immediately coupled to the disable input DIS of the sequencer 82, thereby inhibiting same and preventing further input pulses from being accumulated thereby. The low state signals from the outputs $Q_1$ and $Q_2$ also disable the period measuring counter 84 in turn inhibiting further accumulation by this circuit as well. In addition, the high state signal from the output $Q_3$ is coupled to the input port 86 over the "ready" line 87.

Referring specifically to FIG. 5, the function performed by the "initialize" block 100 shown in FIG. 4 is accomplished in part by a pair of blocks 120, 122 which initially reset the period measuring counter 84 and the sequencer 82 such as at the time $t=t_0$. Following the block 122, the circuitry shown in FIG. 3 proceeds through the above noted steps until a high state signal is impressed on the "ready" line 87 and the period measuring counter 84 is finished accumulating pulses from the system clock in the microprocessor 72.

A block 124 detects the status of the "ready" line 87 and if a block 126 determines that the "ready" line does not have a high state signal thereon, a block 128 then provides a previous or a default value for the value $P_A$. This feature is included to prevent the use of invalid or incomplete data by the microprocessor 72.

On the other hand, if the block 126 determines that the "ready" line has a high state signal thereon, a block 130 then reads the output of the measuring counter 84 in order to determine the output from the PMG 18.

A pair of blocks 132, 134 then reset the period measuring counter 84 and the sequencer 82 and control passes to the main program, block 104 FIG. 4.

The frequency detector of the present invention counts the number of clock pulses that are developed during six input pulses to average out the effect of short term variations in the generator output which, if uncorrected, could cause jitter in the output frequency. If desired, a different number of input pulses may serve to define the clock pulse counting interval.

It can be seen that the control program illustrated in FIGS. 4 and 5 does not depend upon the generation of an interrupt signal or the use of an interrupt handler in order for the microprocessor 72 to acquire data relative to the frequency of the PMG output since this data is acquired at a predetermined point in the control program, i.e. block 102. This, in turn, frees a unused interrupt handler for other tasks and/or reduces the need for additional chips to handle the interrupt handling tasks. Programming is also simplified.

It should be noted that other types of gating arrangements may be used between the sequencer 82 and the period measuring counter 84, depending upon the number of pulses which are to be measured from the signal conditioner 80. For example, if only four pulses are to be measured, then a direct connection between the output $Q_2$ and the gate input of the period measuring counter 84 may be effected in order to accomplish this function.

Also, it should be noted that an MPU sensor may be utilized as the frequency pick-off. In this case, the connections between the sequencer 82 and the counter 84 would be modified to provide the proper clock pulse counting interval, depending upon the number of lobes disposed on the shaft which are sensed by the MPU.

A further advantage of the instant invention over prior detectors which utilize interrupt procedures is that the present invention automatically accepts only one data input per control cycle and hence no provision need be made in the programming to lock out additional inputs.

I claim:

1. A frequency detector for a generating system having a generator driven by a source of motive power, the generator developing an output waveform at an output frequency dependent upon the speed at which the generator is driven, comprising:

means for developing input pulses at a frequency proportional to the output frequency;

a system processor including a clock for developing clock pulses wherein the processor executes a series of control cycles during which the processor controls the speed at which the generator is driven in accordance with the output frequency;

a clock pulse counter having a clock input coupled to the clock, a gating input and an output coupled to the system processor;

means coupled to the gating input of the counter and to the developing means for gating the counter to cause it to accumulate clock pulses during an interval beginning at a first point in time and ending at a second point in time during which a number of input pulses have been developed, including means for inhibiting the counter at the second point in time so that the counter provides at its output an indication of the number of clock pulses accumulated during the interval to in turn derive an indication of the output frequency; and means in the system processor for sensing the indication at the output of the counter at a predetermined point during each control cycle.

2. The frequency detector of claim 1, wherein the gating means comprises a second counter having at least one output coupled to the gating input of the counter, a clock input coupled to the developing means and a disable input coupled to one of the outputs thereof.

3. The frequency detector of claim 2, wherein the gating means includes a logic gate coupled between at least two outputs of the second counter and the gating input of the clock pulse counter.

4. The frequency detector of claim 3, wherein the second counter includes a further output which develops a ready signal when the particular number of input pulses have been developed, the further output being connected to the disable input and also being coupled to the sysem processor.

5. The frequency detector of claim 4, wherein the system processor further includes means operative at the predetermined point during each control cycle for detecting whether the ready signal has been developed and means responsive to the detecting means for providing a predetermined indication of the output frequency if the ready signal has not been developed.

6. The frequency detector of claim 1, further including means for resetting the clock pulse counter once the indication at the output of the clock pulse counter has been sensed.

7. The frequency detector of claim 1, wherein the gating means includes means for preventing further accumulation of clock pulses by the clock pulse counter when six input pulses have been developed during the interval.

8. The frequency detector of claim 7, wherein the preventing means includes an OR gate coupled between two outputs of the gating means and the gating input of the clock pulse counter.

9. The frequency detector of claim 1, wherein the gating means includes a disable input coupled to one of the outputs of the gating means, such output developing a high state signal when the particular number of input pulses have been developed, in turn disabling the gating means and preventing further accumulation of clock pulses by the clock pulse counter.

10. In a system for controlling the output frequency of a generating system driven by a source of motive power including means for sensing such output frequency and a system processor which executes a series of control cycles during which the processor controls the speed at which the generating system is driven in accordance with the sensed output frequency, the processor having a clock which develops a series of clock pulses, the improvment comprising:
   means, in the sensing means and coupled to the processor for developing a count of the number of clock pulses which are developed during an interval between points in the generating system output including means for generating a ready signal when the count is developed and means for holding the count;
   means in the processor for determining whether the ready signal has been generated; and
   means in the processor for detecting the count at a predetermined point during a control cycle if the ready signal has been generated.

11. The improvement of claim 10 further including means coupled to the developing means for generating a reset signal once the count is detected to reset the developing means and to initiate development of a new count.

12. The improvement of claim 10, wherein the generating system includes a permanent magnet generator (PMG) and wherein the developing means includes a signal conditioner coupled to the PMG output for producing a series of pulses at the output frequency of the PMG, and wherein the developing means further includes means for counting a predetermined number of pulses to establish the interval.

13. The improvement of claim 10, further including means for providing a predetermined count if the ready signal has not been generated at the predetermined point.

14. The improvement of claim 10, wherein the holding means includes a disable input and means for coupling the ready signal to the disable input at the end of the interval to hold the count.

15. The improvement of claim 10, wherein the source of motive power includes a shaft coupled to the generating system, and wherein the sensing means further includes a plurality of lobes and a magnetic pick-up disposed adjacent the shaft for sensing the rotation of the lobes to in turn develop a series of MPU pulses having a frequency proportional to the rotational speed of the shaft.

16. The improvement of claim 15, wherein the developing means includes a sequencer coupled to the MPU having an output which indicates when a particular number of MPU pulses have been accumulated by the sequencer and a clock pulse counter which counts the number of clock pulses which are developed as the particular number of MPU pulses are accumulated.

17. The improvement of claim 16, wherein the clock pulse counter includes a gating input coupled to the sequencer and wherein the sequencer includes a disable input coupled to the sequencer output to disable the sequencer and hence prevent further counting of clock pulses by the clock pulse counter when the particular number of MPU pulses have been accumulated.

18. The improvement of claim 10, wherein the system processor is a microprocessor including means for resetting the developing means after the count has been detected.

19. The improvement of claim 10, wherein the developing means comprises:
   means for generating a series of input pulses at a frequency proportional to the output frequency,
   a sequencer having a clock input coupled to the first, second and third input pulses and outputs which assume a high state when two, four and eight input pulses are received by the sequencer, respectively, and also having a disable input coupled to the third output,
   an OR gate having first and second inputs connected to the first and second outputs, respectively, and also having an output and
   a clock pulse counter having a clock input coupled to the clock pulse generating means, a gating input coupled to the OR gate and an output coupled to the system processor which develops an indication of the number of clock pulses received by the clock pulse counter while the OR gate output is in a high state.

* * * * *